(12) United States Patent
Ahn et al.

(10) Patent No.: US 10,978,518 B2
(45) Date of Patent: Apr. 13, 2021

(54) DISPLAY PANEL

(71) Applicant: SAMSUNG DISPLAY CO., LTD., Yongin-Si (KR)

(72) Inventors: Jeaheon Ahn, Hwaseong-si (KR); YeoGeon Yoon, Suwon-si (KR); Jeongki Kim, Hwaseong-si (KR); Seok-Joon Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/567,311

(22) Filed: Sep. 11, 2019

(65) Prior Publication Data
US 2020/0219935 A1 Jul. 9, 2020

(30) Foreign Application Priority Data
Jan. 3, 2019 (KR) .......................... 10-2019-0000689

(51) Int. Cl.
*H01L 27/32* (2006.01)
*H01L 51/52* (2006.01)

(52) U.S. Cl.
CPC ........ *H01L 27/322* (2013.01); *H01L 27/3246* (2013.01); *H01L 51/525* (2013.01); *H01L 51/5284* (2013.01)

(58) Field of Classification Search
None
See application file for complete search history.

(56) References Cited

U.S. PATENT DOCUMENTS

| | | | |
|---|---|---|---|
| 9,698,311 B2 | 7/2017 | Greco et al. | |
| 2004/0046184 A1* | 3/2004 | Yanagawa | H01L 27/322 257/200 |
| 2012/0228603 A1* | 9/2012 | Nakamura | H01L 51/5234 257/40 |
| 2014/0306241 A1* | 10/2014 | Hirakata | H01L 27/322 257/79 |
| 2015/0090991 A1* | 4/2015 | Ishii | H01L 27/3272 257/40 |
| 2015/0131029 A1 | 5/2015 | Kaida et al. | |
| 2015/0162386 A1* | 6/2015 | Furuie | H01L 51/5284 257/40 |
| 2015/0340655 A1* | 11/2015 | Lee | H01L 27/322 257/40 |

(Continued)

FOREIGN PATENT DOCUMENTS

| | | |
|---|---|---|
| JP | 2015-143723 A | 8/2015 |
| KR | 10-2016-0017373 A | 2/2016 |

(Continued)

*Primary Examiner* — Michelle Mandala
*Assistant Examiner* — Jordan M Klein
(74) *Attorney, Agent, or Firm* — Lewis Roca Rothgerber Christie LLP (57) ABSTRACT

A display panel includes an upper display substrate including a display area and a non-display area adjacent to the display area, the display area including first to third pixel areas and a light shielding area adjacent to the first to third pixel areas, a lower display substrate including first to third light emitting elements configured to emit light of a first color and overlapping the first to third pixel areas, respectively, and a plurality of spacers overlapping the display area and arranged between the upper display substrate and the lower display substrate.

14 Claims, 8 Drawing Sheets

(56) References Cited

U.S. PATENT DOCUMENTS

| | | |
|---|---|---|
| 2016/0041430 A1 | 2/2016 | Lee et al. |
| 2016/0293676 A1* | 10/2016 | Komatsu ............. H01L 27/3213 |
| 2016/0306226 A1 | 10/2016 | Yoon et al. |
| 2017/0179438 A1* | 6/2017 | Xu ........................ H01L 27/322 |
| 2017/0244009 A1 | 8/2017 | Lee et al. |
| 2017/0343853 A1 | 11/2017 | Lee et al. |

FOREIGN PATENT DOCUMENTS

| | | |
|---|---|---|
| KR | 10-2016-0038094 A | 4/2016 |
| KR | 10-2016-0124977 A | 10/2016 |
| KR | 10-2017-0136109 A | 12/2017 |

* cited by examiner

DISPLAY PANEL

CROSS-REFERENCE TO RELATED APPLICATION

This application claims priority to and the benefit of Korean Patent Application No. 10-2019-0000689, filed on Jan. 3, 2019 in the Korean Intellectual Property Office, the entire content of which is hereby incorporated by reference.

BACKGROUND

1. Field

Aspects of embodiments of the present disclosure relate to a display panel.

2. Description of the Related Art

The display panel includes a transmissive display panel for selectively transmitting a source light generated from a light source and a light-emitting display panel for generating a source light therein. The display panel may include a different type of light control layer depending on the pixels to generate a color image. The light control layer may transmit only a part of the wavelength range of the source light or convert the color of the source light. Some light control layers may change the characteristics of the light without changing the color of the source light.

SUMMARY

According to an aspect of embodiments of the present disclosure, a display panel including a light control layer is provided. According to another aspect of embodiments of the present disclosure, a display panel in which visibility may be improved is provided.

According to one or more embodiments, a display panel includes: an upper display substrate including a display area and a non-display area adjacent to the display area, wherein the display area includes first to third pixel areas and a light shielding area adjacent to the first to third pixel areas; a lower display substrate including first to third light emitting elements configured to emit a first color light and overlapping the first to third pixel areas, respectively; and a plurality of spacers overlapping the display area and arranged between the upper display substrate and the lower display substrate, wherein the upper display substrate includes: a base substrate; and a light control layer on the base substrate and configured to convert the first color light to output light of a different color, wherein the upper display substrate and the lower display substrate are spaced apart from each other with the plurality of spacers therebetween.

In an embodiment, the light control layer may include: a first conversion part including a first illuminant configured to convert the first color light and emit a second color light different from the first color and overlapping the first pixel area; a second conversion part including a second illuminant configured to convert the first color light and emit a third color light different from the first color and the second color and overlapping the second pixel area; and a transmission part configured to transmit the first color light and overlapping the third pixel area.

In an embodiment, the spacers may include: a first spacer between the first conversion part and the first light emitting element; a second spacer between the second conversion part and the second light emitting element; and a third spacer between the transmission part and the third light emitting element.

In an embodiment, the spacers may overlap the light shielding area and may be arranged in at least one space of a space between the first conversion part and the second conversion part, a space between the second conversion part and the transmission part, and a space between the transmission part and the first conversion part.

In an embodiment, the lower display substrate may include a lower base substrate and a display element layer on the lower base substrate and including the first to third light emitting elements and a pixel defining layer, wherein each of the first to third light emitting elements may include a first electrode, a pixel defining layer including an opening part exposing at least a portion of the first electrode, a second electrode, and a light emitting layer between the first electrode and the second electrode, wherein the spacers may not overlap the opening part.

In an embodiment, the light emitting layer of the first to third light emitting elements may be provided in an integral shape.

In an embodiment, the display panel may further include an adhesive member overlapping the non-display area and arranged between the upper display substrate and the lower display substrate and defining an inner space together with the upper display substrate and the lower display substrate.

In an embodiment, the display panel may further include a filler configured to fill a separation space between the upper display substrate and the lower display substrate on which the spacers are arranged.

In an embodiment, the display panel may further include an air layer in a separation space between the upper display substrate and the lower display substrate on which the spacers are arranged.

In an embodiment, the lower display substrate may further include a cover layer covering the first to third light emitting elements, wherein the spacers may be between the light control layer and the cover layer.

In an embodiment, the spacers may overlap the light shielding area.

In an embodiment, the first to third pixel areas may be sequentially and alternately arranged along a first direction, wherein the first to third pixel areas may be arranged as pixel areas emitting light of a same color along a second direction intersecting the first direction, wherein the spacers may be between two neighboring pixel areas among the pixel areas arranged along the second direction.

In an embodiment, the upper display substrate may further include a color filter layer, wherein the color filter layer may include: a first color filter between the base substrate and the light control layer and overlapping the first pixel area; a second color filter between the base substrate and the light control layer and overlapping the second pixel area; and a third color filter between the base substrate and the light control layer and overlapping the third pixel area.

In an embodiment, the first color filter may be configured to transmit a second color different from the first color, the second color filter may be configured to transmit a third color different from the first color and the second color, and the third color filter may be configured to transmit the first color.

In an embodiment, the upper display substrate may further include a low refractive layer between the color filter layer and the light control layer.

In an embodiment, the first color may be blue.

According to one or more embodiments, a display panel includes: an upper display substrate including a display area and a non-display area adjacent to the display area, wherein the display area includes first to third pixel areas and a light shielding area adjacent to the first to third pixel areas; a lower display substrate including first to third light emitting elements configured to emit a first color light and overlapping the first to third pixel areas, respectively; and a plurality of spacers overlapping the display area and arranged between the upper display substrate and the lower display substrate to provide a separation space between the upper display substrate and the lower display substrate, wherein the upper display substrate includes: a base substrate; a light control layer on the base substrate and configured to convert the first color light as light of a different color and emit the converted first color light; and a light shielding member overlapping the light shielding area and arranged between the base substrate and the light control layer, wherein the spacers have a structure extending from the light shielding member in the separation space.

In an embodiment, the upper display substrate may further include first to third color filters between the base substrate and the light control layer, and overlapping the first to third pixel areas, respectively, and partitioned by the light shielding member or the spacers.

In an embodiment, in a thickness direction of the upper display substrate, a thickness of each of the spacers may be larger than a thickness of the first to third color filters.

In an embodiment, the spacers may be between two neighboring pixel areas that emit light of different colors among the first to third pixel areas.

BRIEF DESCRIPTION OF THE FIGURES

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

In this specification, when it is mentioned that a component (or an area, a layer, a part, etc.) is referred to as being "on," "connected to," or "combined to" another component, this means that the component may be directly on, connected to, or combined to the other component or one or more other components may be present therebetween.

Like reference numerals refer to like elements. Additionally, in the drawings, the thicknesses, proportions, and dimensions of components may be exaggerated for reasons of clarity.

"And/or" includes all combinations of one or more of the referenced components.

It is to be understood that the terms "first" and "second" are used herein to describe various components but these components should not be limited by these terms. The above terms are used to distinguish one component from another. For example, a first component may be referred to as a second component and vice versa without departing from the scope of the inventive concept. Singular expressions include plural expressions unless the context clearly dictates otherwise.

In addition, terms such as "below," "the lower side," "on," and "the upper side" are used to describe a relationship of configurations shown in the drawing. The terms are described as a relative concept based on a direction shown in the drawing. It is to be understood that the spatially relative terms are intended to encompass different orientations of the device in use or operation in addition to the orientation depicted in the figures.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

In various embodiments of the inventive concept, the terms "include," "comprise," "including," or "comprising," specify a property, a region, a fixed number, a step, a process, an element, and/or a component, but do not exclude other properties, regions, fixed numbers, steps, processes, elements, and/or components.

Herein, some example embodiments of the inventive concept will be described with reference to the drawings.

Figure 1A:
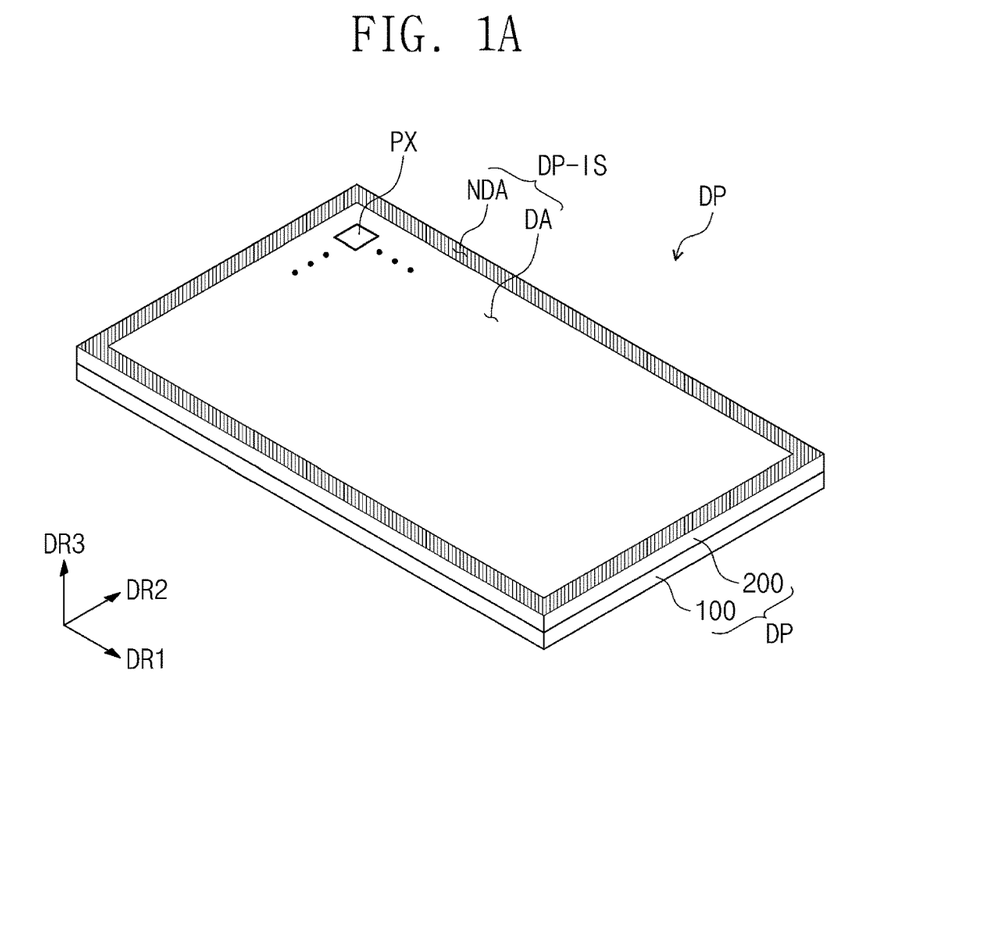
FIG. 1A is a perspective view of a display panel according to an embodiment of the inventive concept.
Figure 1B:
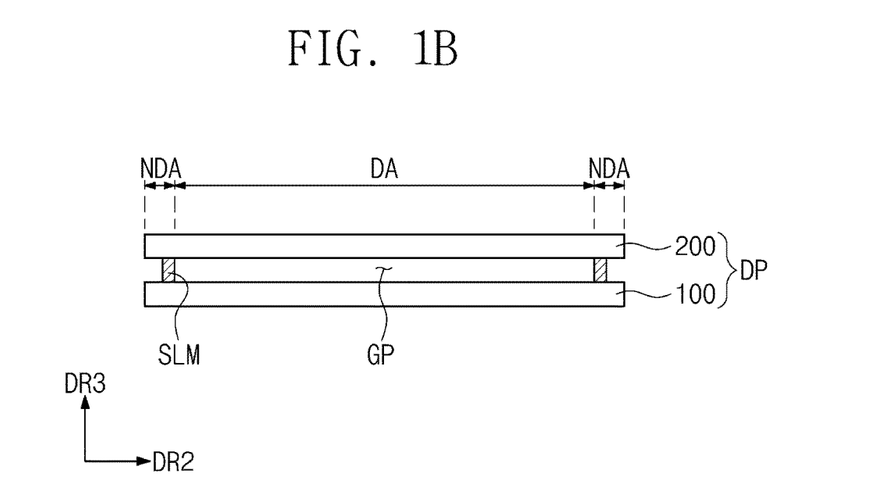
FIG. 1B is a cross-sectional view of a display panel according to an embodiment of the inventive concept.

FIG. 1A is a perspective view of a display panel according to an embodiment of the inventive concept; and FIG. 1B is a cross-sectional view of a display panel according to an embodiment of the inventive concept.

A display panel DP according to an embodiment of the inventive concept may be applied to medium-sized electronic devices, such as personal computers, notebook computers, personal digital terminals, car navigation units, game machines, smartphones, tablets, and cameras, in addition to large-sized electronic devices, such as monitors, or external billboards. However, these are merely some examples, and it will be understood that the display panel DP may be employed in other electronic devices without departing from the scope of the inventive concept.

According to an embodiment of the inventive concept, the display panel DP may be any of a liquid crystal display panel, an electrophoretic display panel, a microelectromechanical system (MEMS) display panel, an electrowetting display panel, and an organic light emitting display panel, but is not particularly limited thereto.

Although not shown separately, the display panel DP may further include a chassis member or a molding member, and may further include a backlight unit according to a type of the display panel DP.

Referring to FIG. 1A, the display panel DP may include a lower display substrate 100 and an upper display substrate 200 spaced apart from the lower display substrate 100. As shown in FIG. 1A, the display panel DP may display an image through a display surface DP-IS. The display surface DP-IS may be parallel to a plane defined by a first direction DR1 and a second direction DR2.

The display surface DP-IS may include a display area DA and a non-display area NDA. A pixel PX is disposed in the display area DA and the pixel PX is not disposed in the non-display area NDA. In an embodiment, the non-display area NDA is defined outside a periphery of the display surface DP-IS. In an embodiment, the display area DA may be surrounded by the non-display area NDA.

A normal direction of the display surface DP-IS, that is, a thickness direction of the display panel DP, is indicated by a third direction DR3. In this specification, the meaning of "viewed on a plane or being on a plane" means that it is viewed in the third direction DR3. The front surface (or upper surface) and the back surface (or lower surface) of each of the layers or units described below are distinguished by the third direction DR3. However, the directions that the first to third directions DR1, DR2, and DR3 indicate may be converted to other directions, for example, opposite directions, as a relative concept.

In an embodiment of the inventive concept, the display panel DP having the planar display surface DP-IS is shown, but the inventive concept is not limited thereto. In an embodiment, the display panel DP may include a curved display surface or a stereoscopic display surface. The stereoscopic display surface may include a plurality of display areas indicating different directions.

Referring to FIG. 1B, an inner space (e.g., a predetermined inner space) GP may be defined between the upper display substrate 200 and the lower display substrate 100. A sealant SLM overlaps the non-display area NDA and may be disposed between the upper display substrate 200 and the lower display substrate 100. In addition, the inner space GP may be provided by the sealant SLM coupling the upper display substrate 200 and the lower display substrate 100. The sealant SLM overlaps the non-display area NDA and may include an organic bonding member or an inorganic bonding member. In an embodiment, the sealant SLM may include frit.

Figure 2A:
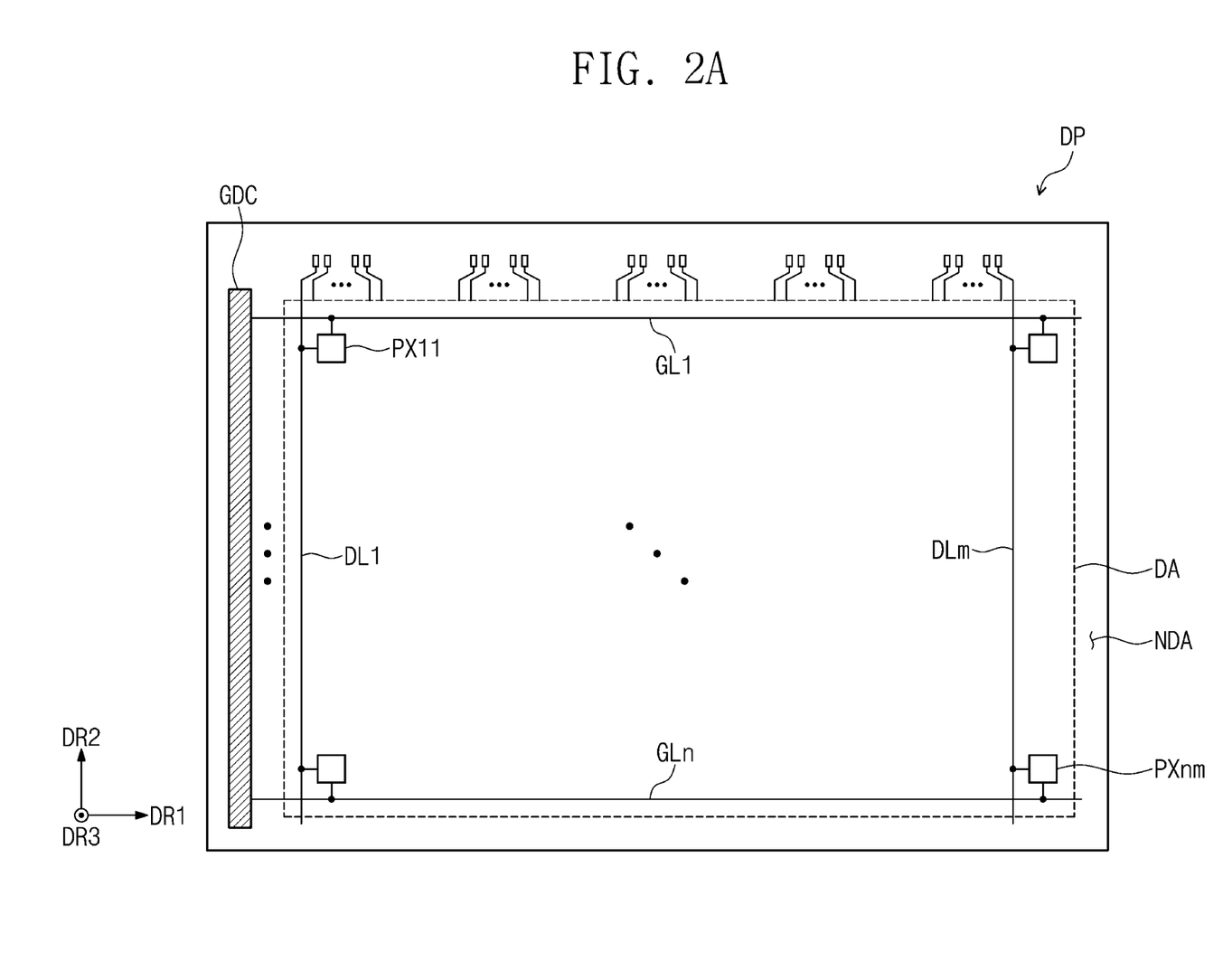
FIG. 2A is a plan view of a display panel according to an embodiment of the inventive concept.
Figure 2B:
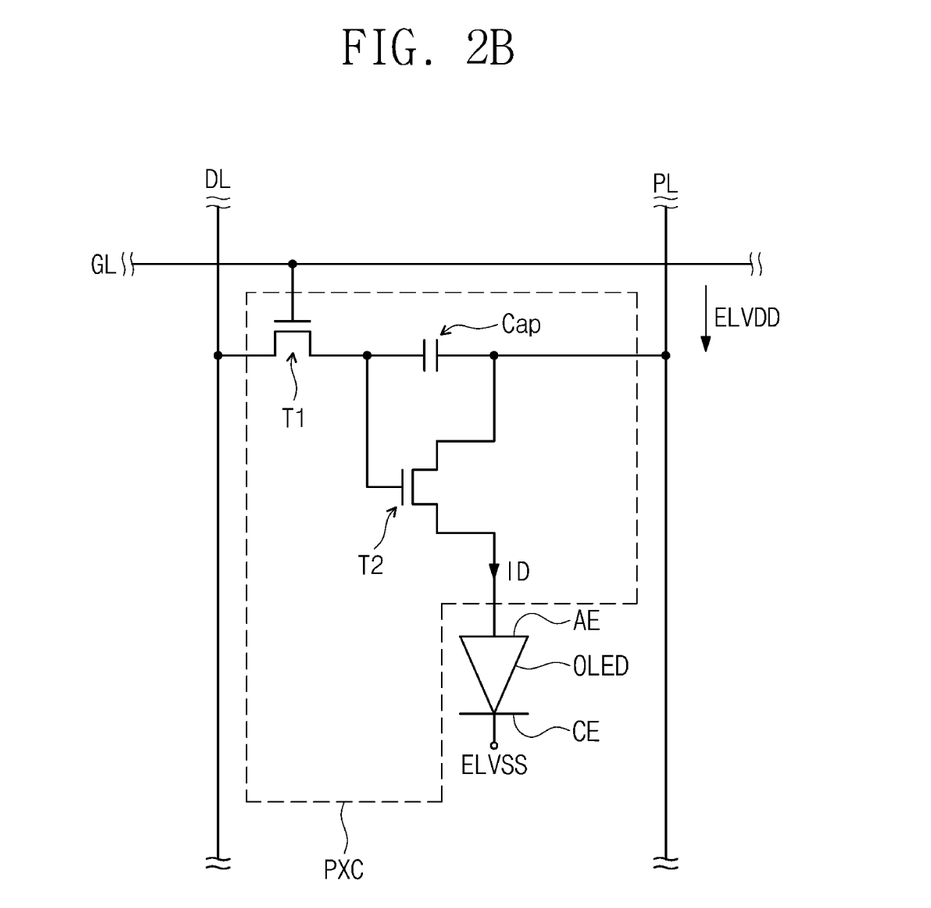
FIG. 2B is an equivalent circuit diagram of a pixel shown in FIG. 2A.

FIG. 2A is a plan view of a display panel according to an embodiment of the inventive concept; and FIG. 2B is an equivalent circuit diagram of a pixel shown in FIG. 2A.

Referring to FIG. 2A, an arrangement relationship of signal lines GL1 to GLn and DL1 to DLm and pixels PX11 to PXnm on a plane is shown. The signal lines GL1 to GLn and DL1 to DLm may include a plurality of gate lines GL1 to GLn and a plurality of data lines DL1 to DLm.

Each of the pixels PX11 to PXnm is connected to a corresponding one of the plurality of gate lines GL1 to GLn and a corresponding one of the plurality of data lines DL1 to DLm. Each of the pixels PX11 to PXnm may include a pixel driving circuit and a display element. Depending on a configuration of the pixel driving circuit, more kinds of signal lines may be provided on the display panel DP.

The pixels PX11 to PXnm may be disposed in a matrix but are not limited thereto. In an embodiment, the pixels PX11 to PXnm may be disposed in a PenTile form. In an embodiment, the pixels PX11 to PXnm may be disposed in a diamond form.

A gate driving circuit GDC may be disposed in the non-display area NDA. In an embodiment, the gate driving circuit GDC may be integrated into the display panel DP through an oxide silicon gate driver circuit (OSG) or an amorphous silicon gate driver circuit (ASG) process.

Referring to FIG. 2B, a pixel PX connected to one gate line GL, one data line DL, and one power supply line PL among the pixels PX11 to PXnm is illustratively shown. However, a configuration of the pixel PX is not limited thereto and may be variously implemented.

According to the inventive concept, the pixel PX includes a light emitting element OLED, a first electrode AE, a second electrode CE, and a pixel circuit PXC. According to an embodiment, the light emitting element OLED may emit light of the first color. In an embodiment, the first color may be blue having a wavelength band of about 400 nm to about 520 nm. Further, the light emitting device OLED may include a light emitting layer that generates light by itself. Herein, the light emitting element OLED is described as an organic light emitting element.

Figure 4:
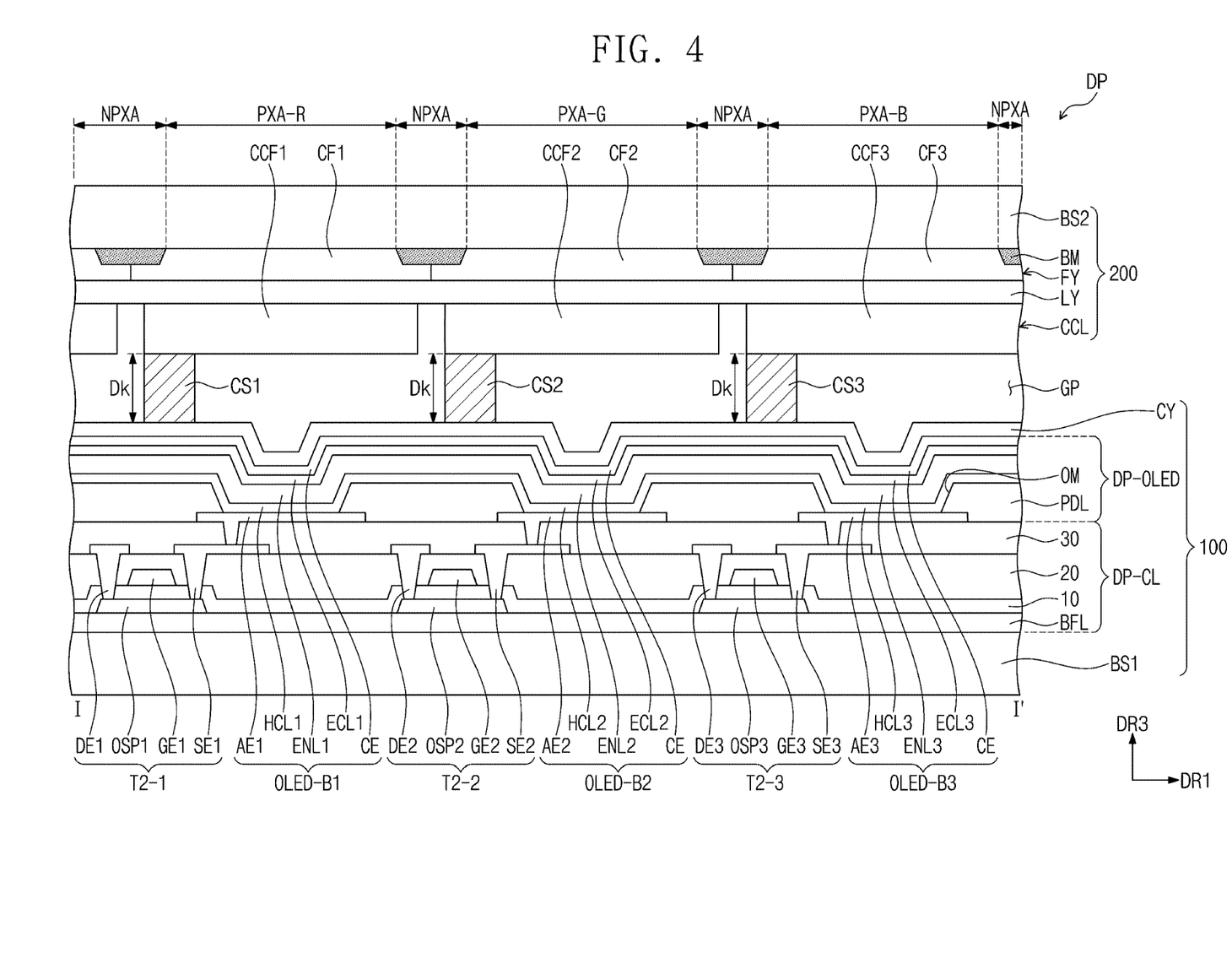
FIG. 4 is a cross-sectional view taken along the line I-I' of FIG. 3 according to an embodiment of the inventive concept.

The light emitting element OLED, the first electrode AE, and the second electrode CE may be included in a display element layer DP-OLED (see FIG. 4).

The pixel circuit PXC as a circuit part for driving the light emitting element OLED includes a first transistor T1 (or a switching transistor), a second transistor T2 (or a driving transistor), and a capacitor Cap. The pixel circuit PXC may be included in a circuit element layer DP-CL (see FIG. 4).

The light emitting element OLED generates light of the first color by an electrical signal provided from the first and second transistors T1 and T2.

The first transistor T1 outputs a data signal applied to the data line DL in response to a gate signal applied to the gate line GL. The capacitor Cap charges a voltage corresponding to a data signal received from the first transistor T1. A first power supply voltage ELVDD is provided to the first electrode AE through the second transistor T2 and a second power supply voltage ELVSS is provided to the second electrode CE. The second power supply voltage ELVSS may have a lower level than the first power supply voltage ELVDD.

The second transistor T2 is electrically connected to the light emitting element OLED through the first electrode AE. The second transistor T2 controls a driving current ID flowing to the light emitting element OLED in correspondence to an amount of charge stored in the capacitor Cap. The light emitting element OLED may emit light during a turn-on section of the second transistor T2.

Figure 3:
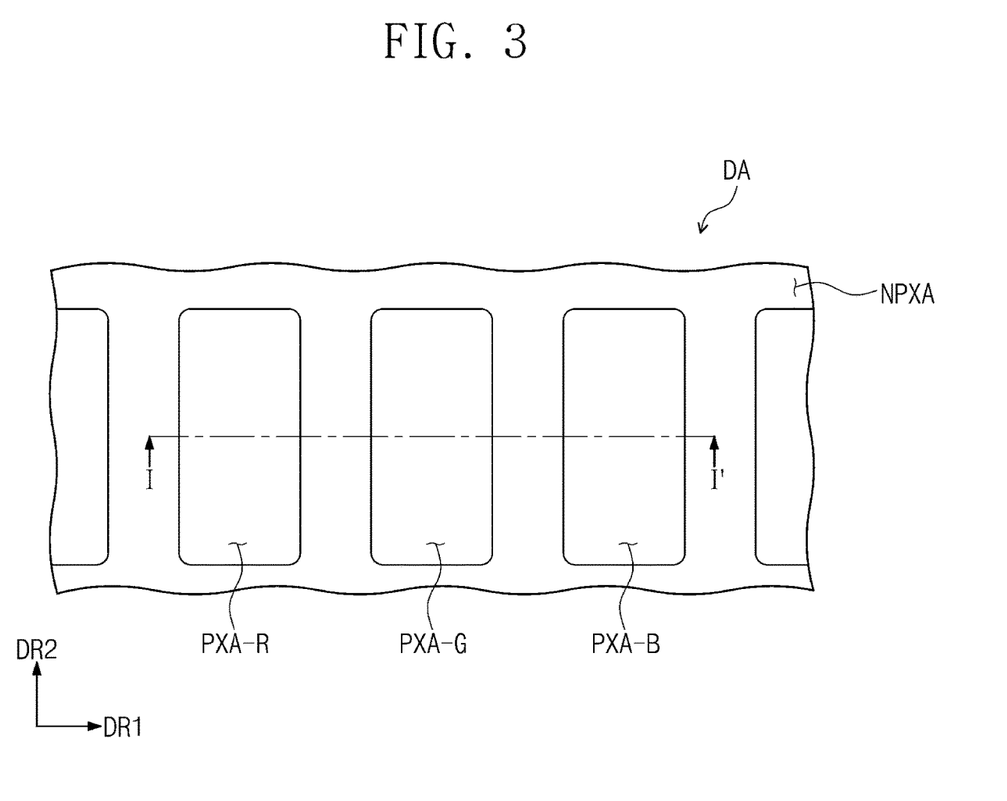
FIG. 3 is a plan view of pixel areas of a display panel according to an embodiment of the inventive concept.
Figure 5:
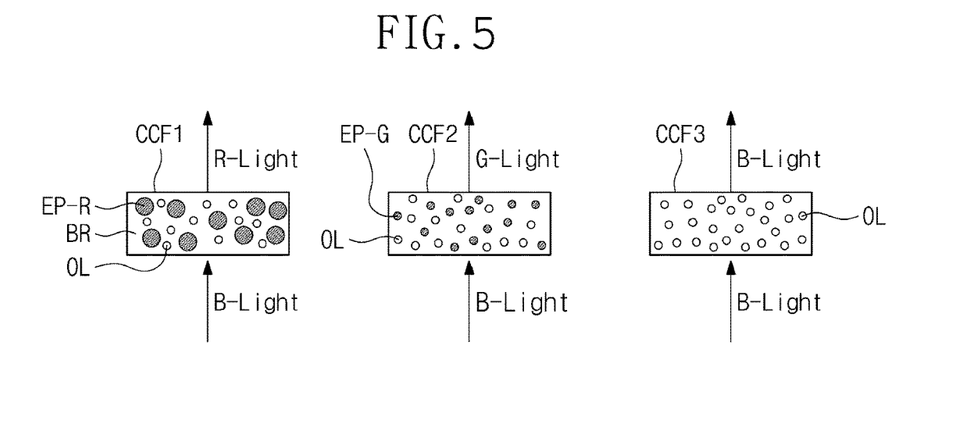
FIG. 5 is a view schematically illustrating optical characteristics of a control layer according to an embodiment of an inventive concept.

FIG. 3 is a plan view of pixel areas of a display panel according to an embodiment of the inventive concept; FIG. 4 is a cross-sectional view taken along the line I-I' of FIG. 3 according to an embodiment of the inventive concept; and FIG. 5 is a view schematically illustrating optical characteristics of a control layer according to an embodiment of an inventive concept.

FIG. 3 is an enlarged view of a portion of the display area DA shown in FIG. 1A. Three kinds of pixel areas PXA-R, PXA-G, and PXA-B are mainly shown. The three kinds of pixel areas PXA-R, PXA-G, and PXA-B shown in FIG. 3 may be repeatedly arranged over the entire display area DA. In this specification, the pixel area means an area through which light is actually emitted to the outside through the upper display substrate 200.

A light shielding area NPXA is disposed around the first to third pixel areas PXA-R, PXA-G, and PXA-B. The first to third pixel areas PXA-R, PXA-G, and PXA-B and the light shielding area NPXA may be substantially defined on the upper display substrate 200.

The first to third pixel areas PXA-R, PXA-G, and PXA-B having a same area on a plane are exemplarily shown in FIG.

3, but the inventive concept is not limited thereto. In an embodiment, the first to third pixel areas PXA-R, PXA-G, and PXA-B may have different areas, or at least two areas may be different from each other. Also, although the first to third pixel areas PXA-R, PXA-G, and PXA-B having a rounded corner area on a plane are shown, the inventive concept is not limited thereto. In an embodiment, the first to third pixel areas PXA-R, PXA-G, and PXA-B on a plane may have another polygonal form, and the corner area may have a rounded regular polygonal form.

One of the first to third pixel areas PXA-R, PXA-G, and PXA-B provides the first color light having the wavelength band of the first color, another provides a second color light having a second wavelength band different from the first color, and the remaining one provides a third color light having a wavelength band of a third color different from the first color and the second color, to a user.

According to an embodiment of the inventive concept, the first pixel area PXA-R provides red light, the second pixel area PXA-G provides green light, and the third pixel area PXA-B provides blue light. In this embodiment, the source light may be blue light, which is the third color light. The source light may be generated in a light source such as a backlight unit, or may be generated in a display device such as a light emitting diode.

The light shielding area NPXA sets the boundaries of the first to third pixel areas PXA-R, PXA-G, and PXA-B to prevent or substantially prevent color mixing therebetween. Also, the light shielding area NPXA blocks the source light such that the source light is not provided to the user.

Referring to FIG. 4, the display panel DP includes the lower display substrate 100 and the upper display substrate 200.

The lower display substrate 100 includes a first base substrate BS1, the circuit element layer DP-CL, the display element layer DP-OLED, and a cover layer CY.

The first base substrate BS1 may include a synthetic resin substrate or a glass substrate. The circuit element layer DP-CL includes at least one insulating layer and circuit element. The circuit element includes a signal line and the pixel circuit PXC or the like shown in FIG. 2B. The circuit element layer DP-CL may be formed through a formation process of an insulating layer, a semiconductor layer, and a conductive layer by coating, a deposition, and the like, and a patterning process of an insulating layer, a semiconductor layer, and a conductive layer by a photolithography process. In this specification, the first base substrate BS1 may be described as a lower base substrate.

The circuit element layer DP-CL may include a buffer film BFL, a first insulating layer 10, a second insulating layer 20, a third insulating layer 30, and first to third driving transistors T2-1, T2-2, and T2-3. The first insulating layer 10 and the second insulating layer 20 according to the inventive concept may be inorganic films, and the third insulating layer 30 may be an organic film.

The first driving transistor T2-1 includes a first semiconductor pattern OSP1, a first control electrode GE1, a first input electrode DE1, and a first output electrode SE1. The second driving transistor T2-2 includes a second semiconductor pattern OSP2, a second control electrode GE2, a second input electrode DE2, and a second output electrode SE2. The third driving transistor T2-3 includes a third semiconductor pattern OSP3, a third control electrode GE3, a third input electrode DE3, and a third output electrode SE3.

The first semiconductor pattern OSP1, the second semiconductor pattern OSP2, and the third semiconductor pattern OSP3 are disposed on the buffer film BFL disposed on the first base substrate BS1. The first insulating layer 10 covers the first semiconductor pattern OSP1, the second semiconductor pattern OSP2, and the third semiconductor pattern OSP3 and is disposed on the buffer film BFL.

The first control electrode GE1, the second control electrode GE2, and the third control electrode GE3 overlap the first semiconductor pattern OSP1, the second semiconductor pattern OSP2, and the third semiconductor pattern OSP3, respectively, and are disposed on the first insulating layer 10. The second insulating layer 20 covers the first control electrode GE1, the second control electrode GE2, and the third control electrode GE3 and is disposed on the first insulating layer 10.

The first input electrode DE1 and the first output electrode SE1 are disposed on the second insulating layer 20. Although not shown in the drawing, the first input electrode DE1 and the first output electrode SE1 may be connected to the first semiconductor pattern OSP1 through a first through-hole and a second through-hole penetrating the first insulating layer 10 and the second insulating layer 20, respectively.

The second input electrode DE2 and the second output electrode SE2 are disposed on the second insulating layer 20. Although not shown in the drawing, the second input electrode DE2 and the second output electrode SE2 may be connected to the second semiconductor pattern OSP2 through a fourth through-hole and a fifth through-hole penetrating the first insulating layer 10 and the second insulating layer 20, respectively.

The third input electrode DE3 and the third output electrode SE3 are disposed on the second insulating layer 20. Although not shown in the drawing, the third input electrode DE3 and the third output electrode SE3 may be connected to the third semiconductor pattern OSP3 through a seventh through-hole and an eighth through-hole penetrating the first insulating layer 10 and the second insulating layer 20, respectively.

The third insulating layer 30 covers the first to third input electrodes DE1, DE2, and DE3 and the first to third output electrodes SE1, SE2, and SE3, and is disposed on the second insulating layer 20. The display element layer DP-OLED may be disposed on the third insulating layer 30.

The display element layer DP-OLED includes first to third light emitting elements OLED-B1, OLED-B2, and OLED-B3. The first to third light emitting elements OLED-B1, OLED-B2, and OLED-B3 may overlap the first to third pixel areas PXA-R, PXA-G, and PXA-B, respectively. According to an embodiment of the inventive concept, each of the first to third light emitting elements OLED-B1, OLED-B2, and OLED-B3 may include an organic light emitting element that generates a first color light corresponding to blue.

The first light emitting element OLED-B1 includes a first sub-electrode AE1, a second electrode CE, a first hole control layer HCL1, a first electron control layer ECL1, and a first light emitting layer ENL1. The first sub-electrode AE1 is disposed on the third insulating layer 30. The first sub-electrode AE1 is connected to the first output electrode SE1 through a third through-hole passing through the third insulating layer 30. A light emitting opening part OM is defined in the pixel defining layer PDL. Hereinafter, in this specification, the light emitting opening part OM refers to an area where light is emitted through a light emitting element.

The first hole control layer HCL1 may include a hole transport layer and may further include a hole injection layer. A first light emitting layer ENL1 is disposed on the first hole control layer HCL1. The first light emitting layer ENL1 may be disposed in an area corresponding to the light emitting opening part OM. The first light emitting layer ENL1 may output the first color light. A first electron control layer ECL1 is disposed on the first light emitting layer ENL1. The first electron control layer ECL1 may include an electron transport layer and may further include an electron injection layer. The second light emitting element OLED-B2 includes a second sub-electrode AE2, a second electrode CE, a second hole control layer HCL2, a second electron control layer ECL2, and a second light emitting layer ENL2. The second sub-electrode AE2 disposed on the third insulating layer 30 is connected to the second output electrode SE2 through a sixth through-hole. The second hole control layer HCL2 may be provided integrally with the first hole control layer HCL1, and the second electron control layer ECL2 may be provided integrally with the first electron control layer ECL1.

The third light emitting element OLED-B3 includes a third sub-electrode AE3, a second electrode CE, a third hole control layer HCL3, a third electron control layer ECL3, and a third light emitting layer ENL3. The third sub-electrode AE3 disposed on the third insulating layer 30 is connected to the third output electrode SE3 through a ninth through hole. The third hole control layer HCL3 may be provided integrally with the first hole control layer HCL1, and the third electron control layer ECL3 may be provided integrally with the first electron control layer ECL1.

The structure of the second light emitting element OLED-B2 and the third light emitting element OLED-B3 may be substantially the same as the structure of the first light emitting element OLED-B1.

According to an embodiment of the inventive concept, the first to third light emitting layers ENL1, ENL2, and ENL3 may be provided in an integral shape. That is, the first to third light emitting layers ENL1, ENL2, and ENL3 may be disposed on the first to third sub-electrodes AE1, AE2, and AE3, respectively. Also, the second electrode CE may be provided in an integral shape, and may be disposed on the first to third light emitting layers ENL1, ENL2, and ENL3.

The cover layer CY may be disposed on the second electrode CE. The cover layer CY may be provided as an insulating layer containing an organic material or an inorganic material. In one embodiment, the cover layer CY may be omitted.

The upper display substrate 200 includes a second base substrate BS2, a light shielding member BM, a color filter layer FY, a light control layer CCL, a low refractive layer LY, and a plurality of spacers CS1, CS2, and CS3.

The second base substrate BS2 includes a synthetic resin substrate or a glass substrate and may face the first base substrate BS1 in the third direction DR3. In this specification, the second base substrate BS2 may be described as an upper base substrate.

The light shielding member BM overlaps the light shielding area NPXA on a plane and may be disposed on the second base substrate BS2. As an example, the light shielding member BM may be disposed directly on the second base substrate BS2.

The color filter layer FY may include first to third color filters CF1, CF2, and CF3. The first to third color filters CF1, CF2, and CF3 may overlap the first to third pixel areas PXA-R, PXA-G, and PXA-B, respectively. In one example, each of the first to third color filters CF1, CF2, and CF3 may partially overlap the light shielding area NPXA.

The first to third color filters CF1 to CF3 may receive the light transmitted through the light control layer CCL and transmit the light to the second base substrate BS2.

In further detail, the first color filter CF1 is provided with the second color corresponding to red, and may transmit the light of the second color. The first color filter CF1 may receive the light of the second color from the light control layer CCL and emit it to the first pixel area PXA-R.

The second color filter CF2 is provided with the third color corresponding to green, and may transmit the light of the third color. The second color filter CF2 may receive the light of the third color from the light control layer CCL and emit it to the second pixel area PXA-G.

The third color filter CF3 is provided with the first color corresponding to blue, and may transmit the light of the first color. The third color filter CF3 may receive the light of the first color from the light control layer CCL and emit it to the third pixel area PXA-B.

The light control layer CCL may include an illuminant that is disposed on the color filter layer FY and converts the first color light emitted from the display element layer DP-OLED and emits it as a color different from the first color.

The light control layer CCL includes a first conversion part CCF1, a second conversion part CCF2, and a transmission part CCF3. The first conversion part CCF1 converts the light of the first color emitted by the first light emitting opening part exposed by the first sub-electrode AE1 and outputs it as the light of the second color different from the first color. The first conversion part CCF1 may emit the light of the second color to the first color filter CF1.

The second conversion part CCF2 converts the light of the first color emitted by the second light emitting opening part exposed by the second sub-electrode AE2 and outputs it as the light of the third color different from the second color. The second conversion part CCF2 may emit the light of the third color to the second color filter CF2.

The transmission part CCF3 may transmit light of the first color emitted by the third light emitting opening part exposed by the third sub-electrode AE3. The transmission part CCF3 may emit light of the first color to the third color filter CF3.

In an embodiment, referring to FIG. 5, a first illuminant EP-R converts the first color light, which is blue light, and emits the second color light, which is red light, and a second illuminant EP-G converts the first color light and emits the third color light, which is green light. The transmission part CCF3 may be a part that does not contain an illuminant. The transmission part CCF3 may be a part that transmits the first color light.

In addition, the first to third conversion parts CCF1, CCF2, and CCF3 may include a base resin BR. The base resin BR may be a polymer resin. For example, the base resin BR may be an acrylic resin, a urethane resin, a silicone resin, an epoxy resin, or the like. The base resin BR may be a transparent resin.

In addition, each of the first conversion part CCF1, the second conversion part CCF2, and the transmission part CCF3 may further include a scattering particle OL. In an embodiment, the scattering particles OL may be $TiO_2$ or silica-based nanoparticles. The scattering particle OP may scatter light emitted from an illuminant and emit it to the outside of the conversion part. Also, in the case of transmitting the provided light as it is, like the transmission part CCF3, the scattering particle OL may scatter the provided light and emit it to the outside.

In an embodiment, the first and second illuminants EP-R and EP-G included in the color control layer CCL may be fluorescent substances or quantum dots. In other words, in an embodiment, the color control layer CCL may include at least one of the fluorescent substances or the quantum dots as the illuminants EP-R and EP-G.

For example, the fluorescent substances used as the first and second illuminants EP-R and EP-G may be inorganic fluorescent substances. In the display panel DP according to an embodiment, the fluorescent substances used as the first and second illuminants EP-R and EP-G may be a red fluorescent substance and a green fluorescent substance.

The green fluorescent substance may include at least one selected from the group consisting of YBO3:Ce3+,Tb3+, BaMgAl10O17:Eu2+, Mn2+, (Sr,Ca,Ba)(Al,Ga)2S4:Eu2+; ZnS:Cu,Al, Ca8Mg(SiO4)4Cl2:Eu2+,Mn2+; Ba2SiO4: Eu2+; (Ba,Sr)2SiO4:Eu2+; Ba2(Mg, Zn)Si2O7:Eu2+; (Ba, Sr)Al2O4:Eu2+, Sr2Si3O8.2SrCl2:Eu2+.

The red fluorescent substance may include at least one selected from the group consisting of (Sr,Ca,Ba,Mg)P2O7: Eu2+, Mn2+, CaLa2S4:Ce3+; SrY2S4:Eu2+, (Ca,Sr)S: Eu2+, SrS:Eu2+, Y2O3:Eu3+,Bi3+; YVO4:Eu3+,Bi3+; Y2O2S:Eu3+,Bi3+; Y2O2S:Eu3+.

However, the kinds of the fluorescent substances used in the color control layer CCL are not limited to the materials described above. In other words, the fluorescent substances may use other known fluorescent substances in addition to the fluorescent substance materials described above.

In other embodiments, the first and second illuminants EP-R and EP-G included in the color control layer CCL may be the quantum dots. The quantum dot may be formed of a group II-VI compound, a group III-V compound, a group IV-VI compound, a group IV element, a group IV compound, or any combination thereof.

The group II-VI compound may be selected from the group consisting of a binary compound selected from the group consisting of CdSe, CdTe, ZnS, ZnSe, ZnTe, ZnO, HgS, HgSe, HgTe, MgSe, MgS, and any mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from the group consisting of a binary compound selected from the group consisting of GaN, GaP, GaAs, GaSb, AlN, AlP, AlAs, AlSb, InN, InP, InAs, InSb, and any mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The group IV-VI compound may be selected from the group consisting of a binary compound selected from the group consisting of SnS, SnSe, SnTe, PbS, PbSe, PbTe, and any mixture thereof; a ternary compound selected from the group consisting of SnSeS, SnSeTe, SnSTe, PbSeS, PbSeTe, PbSTe, SnPbS, SnPbSe, SnPbTe, and any mixture thereof; and a quaternary compound selected from the group consisting of SnPbSSe, SnPbSeTe, SnPbSTe, and any mixture thereof. The group IV element may be selected from the group consisting of Si, Ge, and a mixture thereof. The group IV compound may be a binary compound selected from the group consisting of SiC, SiGe, and a mixture thereof.

In these cases, the binary compound, the ternary compound, or the quaternary compound may exist in the quantum dot with a substantially uniform concentration. Alternatively, a concentration of the binary compound, the ternary compound, or the quaternary compound in a portion of the quantum dot may be different from that of the binary compound, the ternary compound, or the quaternary compound in another portion of the quantum dot.

In an embodiment, the quantum dot may have a core-shell structure including a core and a shell surrounding the core. Alternatively, the control part may have a core/shell structure in which one quantum dot surrounds another quantum dot. An interface of the core and the shell may have a concentration gradient in which a concentration of an element existing in the shell becomes progressively less toward a center.

The quantum dot may be a nano-sized particle. The quantum dot may have a full width of half maximum (FWHM) of an emission wavelength spectrum that is about 45 nm or less, and, in an embodiment, about 40 nm or less, and, in an embodiment, about 30 nm or less, and color purity and/or color reproduction can be improved in the range. In addition, light emitted through the quantum dot may be emitted in all directions, and, thus, a wide viewing angle can be improved or realized.

Further, a shape of the quantum dot may be a general shape known in the art, but is not limited to a specific shape. For example, the quantum dot may have a spherical shape, a pyramidal shape, a multi-arm shape, a cubic nanoparticle shape, a nanotube shape, a nanowire shape, a nanofiber shape, or a nano-plate particle shape.

According to an embodiment of the inventive concept, the quantum dot may change the color of light emitted according to the particle size. In an embodiment, when the first illuminant EP-R and the second illuminant EP-G are quantum dots, the particle size of the first illuminant EP-R and the particle size of the second illuminant EP-G may be different from each other. For example, the particle size of the first illuminant EP-R may be larger than that of the second illuminant EP-G. In an embodiment, the first illuminant EP-R may emit light of a longer wavelength than the second illuminant EP-G.

On the other hand, a portion of the first color light provided from the first light emitting element OLED-B1 may be transmitted to the outside as it is without being converted by the first illuminant EP-R. If the first color filter CF1 is omitted, a portion of the first color light may be emitted to the outside through the second base substrate BS2. As a result, the first color light and the second color light are partially mixed, such that the display quality of the image may be deteriorated.

However, according to an embodiment of the inventive concept, as the first color filter CF1 converts the first color light transmitted through the first conversion part CCF1, the first color light may not be delivered to the second base substrate BS2 through the first color filter CF1. Accordingly, the second color light emitted through the first conversion part CCF1 may be outputted through the second base substrate BS2 without mixing with other colors. As a result, the color visibility may be improved.

Referring again to FIG. 4, the low refractive layer LY may be disposed between the light control layer CCL and the color filter layer FY.

According to an embodiment of the inventive concept, a refractive index of the light control layer CCL may be higher than that of the low refractive layer LY. That is, a refractive index of the base resin BR included in the first conversion part CCF1, the second conversion part CCF2, and the transmission part CCF3 may be higher than the refractive index of the low refractive layer LY. Due to the refractive index difference between the low refractive layer LY and the light control layer CCL, a portion of the light outputted from the first conversion part CCF1, the second conversion part CCF2, and the transmission part CCF3 may be totally reflected at the interface of the low refractive layer LY. As a result, the totally-reflected light may be scattered again by the scattering particles OL described with reference to FIG. 5 and may be emitted to the outside. As described above, by the low refractive layer LY, the characteristics of the light emitted from the first conversion part CCF1, the second conversion part CCF2, and the transmission part CCF3 may be improved.

Also, as described above with reference to FIG. 1B, the inner space GP may be provided between the lower display substrate 100 and the upper display substrate 200 spaced apart through the sealant SLM. For example, the first conversion part CCF1, the second conversion part CCF2, and the transmission part CCF3 of the upper display substrate 200 may be spaced apart by an interval (e.g., a predetermined interval) from the cover layer CY of the lower display substrate 100 in the third direction DR3. If the cover layer CY is omitted, the first conversion part CCF1, the second conversion part CCF2, and the transmission part CCF3 may face light emitting elements.

The separation distance between the first conversion part CCF1, the second conversion part CCF2, and the transmission part CCF3 and the cover layer CY in the third direction DR3 should be kept constant. Herein, the separation distance between the first conversion part CCF1, the second conversion part CCF2, and the transmission part CCF3 and the cover layer CY in the third direction DR3 will be described as an internal separation distance Dk.

If the internal separation distance Dk is greater or less than a set length, color mixing may occur in the image outputted from the display panel DP, or the visibility may be deteriorated. For example, if it is assumed that the display panel DP emits an image only through the first pixel area PXA-R, when the internal separation distance Dk is normally maintained, the second color light is emitted only through the first pixel area PXA-R, and light is not emitted through the second pixel area PXA-G and the third pixel area PXA-B.

However, the internal separation distance Dk may vary due to various causes such as moving of the display panel DP. For example, when the internal separation distance Dk increases due to the moving of the display panel DP, the light of the first color emitted from the first light emitting element OLED-B1 may be partially transferred to the second conversion part CCF2 as well as the first conversion part CCF1. In this case, color mixing may occur in which the second color light emitted through the first conversion part CCF1 and the third color light emitted through the second conversion part CCF2 are mixed. As a result, the overall visibility of the display panel DP may be deteriorated.

According to an embodiment of the inventive concept, the plurality of spacers CS1, CS2, and CS3 are disposed between the upper display substrate 200 and the lower display substrate 100, such that the separation space between the upper display substrate 200 and the lower display substrate 100 may be provided. Here, the separation space may be substantially the same as the inner space GP shown in FIG. 1B, and may be provided as an air layer, for example. As a result, the internal separation distance Dk between the upper display substrate 200 and the lower display substrate 100 spaced apart by the spacers CS1, CS2, and CS3 may be kept constant. Each of the plurality of spacers CS1, CS2, CS3 may be provided with a thickness of the internal separation distance Dk.

Also, each of the spacers CS1, CS2, and CS3 may not overlap the light emitting opening part. As the spacers CS1, CS2, CS3 do not overlap the light emitting opening part, the light emitted through the light emitting opening part is not reflected by the spacers CS1, CS2, and CS3.

In further detail, the spacers CS1, CS2, and CS3 include a first spacer CS1, a second spacer CS2, and a third spacer CS3. As shown in FIG. 4, the first to third spacers CS1 to CS3 may partially overlap the first to third pixel areas PXA-R, PXA-G, and PXA-B, respectively. Further, the first to third spacers CS1 to CS3 may partially overlap a light shielding area NPXA, that is, the light shielding member BM.

According to the inventive concept, although the first to third spacers CS1 to CS3 corresponding to the first to third pixel areas PXA-R, PXA-G and PXA-B are shown, one spacer corresponding to one pixel area may be provided.

The first spacer CS1 is disposed between the first conversion part CCF1 and the cover layer CY. In an embodiment, one end of the first spacer CS1 directly contacts the first conversion part CCF1 and the other end of the first spacer CS1 may directly contact the cover layer CY. As another example, the first spacer CS1 is disposed between the first conversion part CCF1 and the first light emitting element OLED-B1. That is, when the cover layer CY is omitted, one end of the first spacer CS1 may directly contact the first conversion part CCF1, and the other end of the first spacer CS1 may directly contact the second electrode CE of the first light emitting element OLED-B1.

The second spacer CS2 is disposed between the second conversion part CCF2 and the cover layer CY. In an embodiment, one end of the second spacer CS2 directly contacts the second conversion part CCF2 and the other end of the second spacer CS2 may directly contact the cover layer CY. As another example, the second spacer CS2 is disposed between the second conversion part CCF2 and the second light emitting element OLED-B2. That is, when the cover layer CY is omitted, one end of the second spacer CS2 may directly contact the second conversion part CCF2, and the other end of the second spacer CS2 may directly contact the second electrode CE of the second light emitting element OLED-B2.

A third spacer CS3 is disposed between the transmission part CCF3 and the cover layer CY. In an embodiment, one end of the third spacer CS3 directly contacts the transmission part CCF3 and the other end of the third spacer CS3 may directly contact the cover layer CY. As another example, the third spacer CS3 is disposed between the transmission part CCF3 and the third light emitting element OLED-B3. That is, when the cover layer CY is omitted, one end of the third spacer CS3 may directly contact the transmission part CCF3, and the other end of the third spacer CS3 may directly contact the second electrode CE of the third light emitting element OLED-B3.

In addition, each of the first to third spacers CS1 to CS3 according to an embodiment of the inventive concept may be provided in a black color. As a result, as the first to third spacers CS1 to CS3 are provided in the black color, the color mixing of the lights emitted from the first to third light emitting elements OLED-B1 to OLED-B3 may be prevented or substantially prevented.

Figure 6:
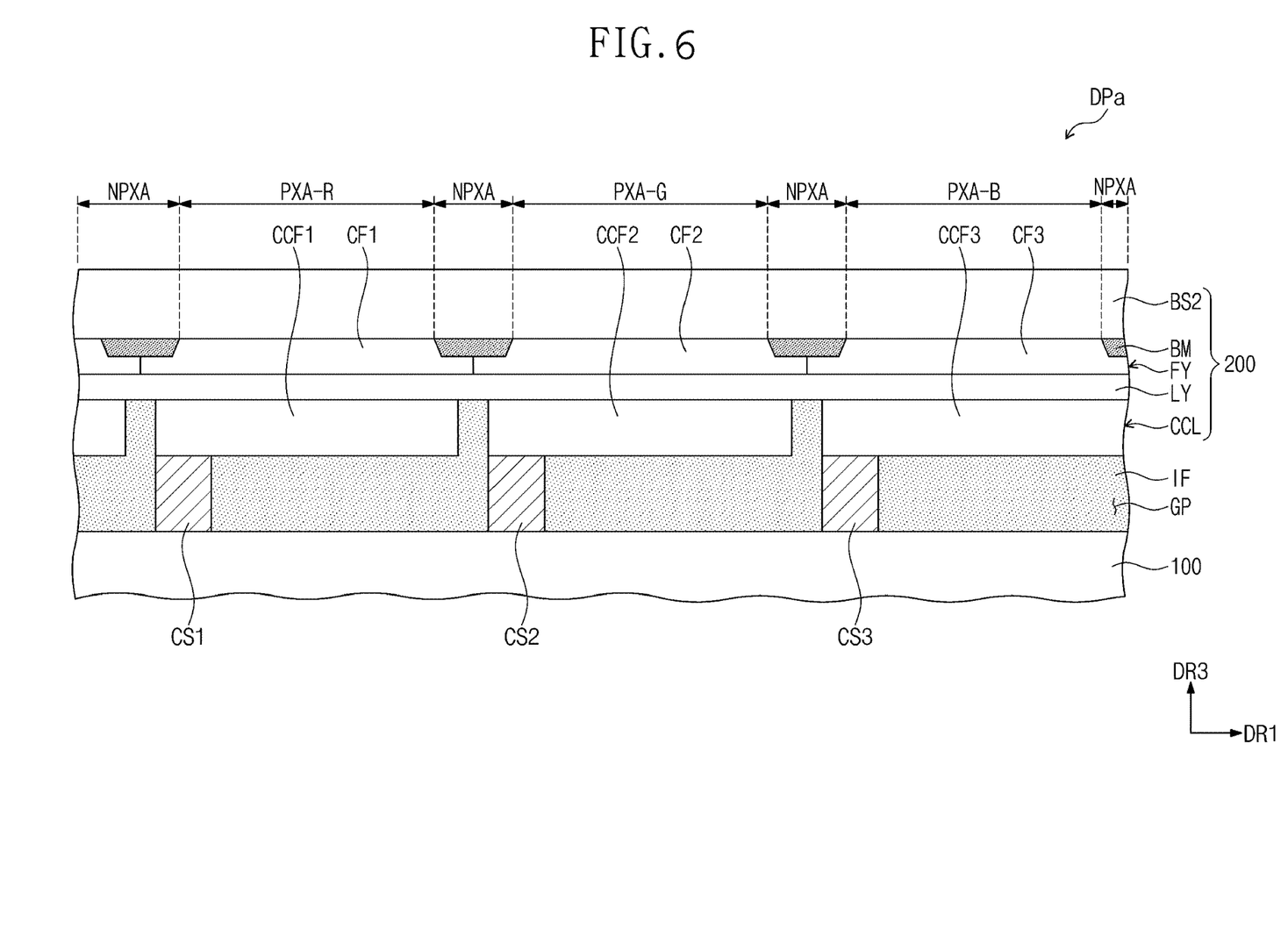
FIG. 6 is a cross-sectional view of pixel areas of a display panel according to another embodiment of the inventive concept.

FIG. 6 is a cross-sectional view of pixel areas of a display panel according to another embodiment of the inventive concept.

As compared with the display panel DP shown in FIG. 4, in relation to a display panel DPa shown in FIG. 6, a configuration of a filler IF is added, and remaining structures may be substantially the same. Therefore, for convenience of explanation, further description of the remaining components is omitted.

Referring to FIG. 6, the filler IF may be included in the inner space GP. In an embodiment, the filler IF may be entirely filled in the inner space GP. As the filler IF is filled in the inner space GP, the internal separation distance Dk between the first conversion part CCF1, the second conversion part CCF2, and the transmission part CCF3 and the cover layer CY may be kept constant.

Further, the filler IF may be provided as a transparent material. That is, the filler IF may transmit light emitted from the first to third light emitting elements OLED-B1 to OLED-B3.

Figure 7:
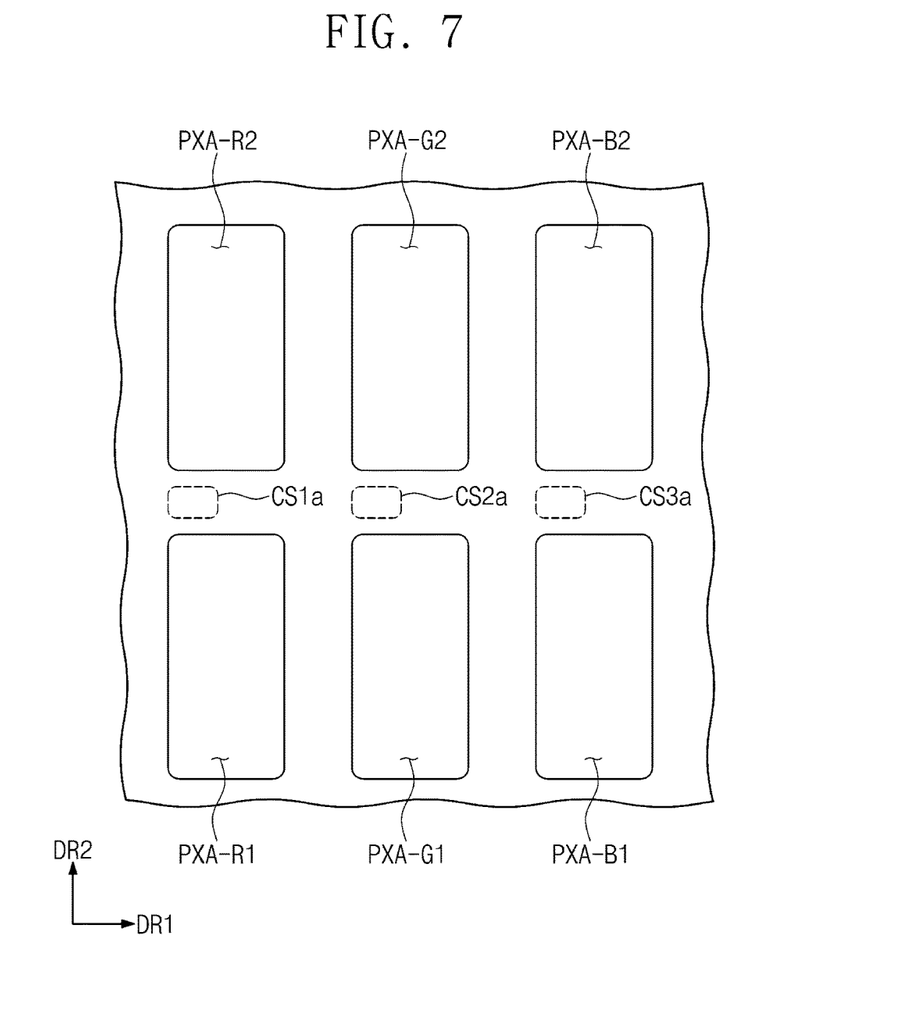
FIG. 7 is a plan view of pixel areas of a display panel according to another embodiment of the inventive concept.

FIG. 7 is a plan view of pixel areas of a display panel according to another embodiment of the inventive concept.

In an embodiment, the first to third pixel areas PXA-R, PXA-G, and PXA-B shown in FIG. 3 may be sequentially alternately arranged along the first direction DR1. In addition, each of the first to third pixel areas PXA-R, PXA-G, and PXA-B may be arranged in pixel areas that emit light of the same color along the second direction DR2. For example, the first pixel area PXA-R may be arranged in the second direction DR2, and may be provided as a plurality of first pixel areas for emitting second color light. The second pixel area PXA-G may be arranged in the second direction DR2, and may be provided as a plurality of second pixel areas for emitting the third color light. The third pixel area PXA-B may be arranged in the second direction DR2, and may be provided as a plurality of third pixel areas for emitting the first color light.

In an embodiment, as shown in FIG. 7, the first to third pixel areas PXA-R1, PXA-G1, and PXA-B1 are arranged in a first row, and fourth to sixth pixel areas PXA-R2, PXA-G2, and PXA-B2 are arranged in a second row.

According to another embodiment of the inventive concept, first spacers CS1a may be disposed between the first pixel areas arranged along the second direction DR2. For example, the first spacer CS1a may be disposed between the first pixel area PXA-R1 and the fourth pixel area PXA-R2.

Second spacers CS2a may be disposed between the second pixel areas arranged along the second direction DR2. For example, the second spacer CS2a may be disposed between the second pixel area PXA-G1 and the fifth pixel area PXA-G2.

A third spacer CS3a may be disposed between the third pixel areas arranged along the second direction DR2. For example, the third spacer CS3a may be disposed between the third pixel area PXA-B1 and the sixth pixel area PXA-B2.

According to an embodiment of the inventive concept, a plurality of spacers that keep the internal separation distance Dk shown in FIG. 4 constant are provided between the pixel areas. Further, each of the plurality of spacers shown in FIG. 7 may overlap the light shielding area NPXA.

Figure 8:
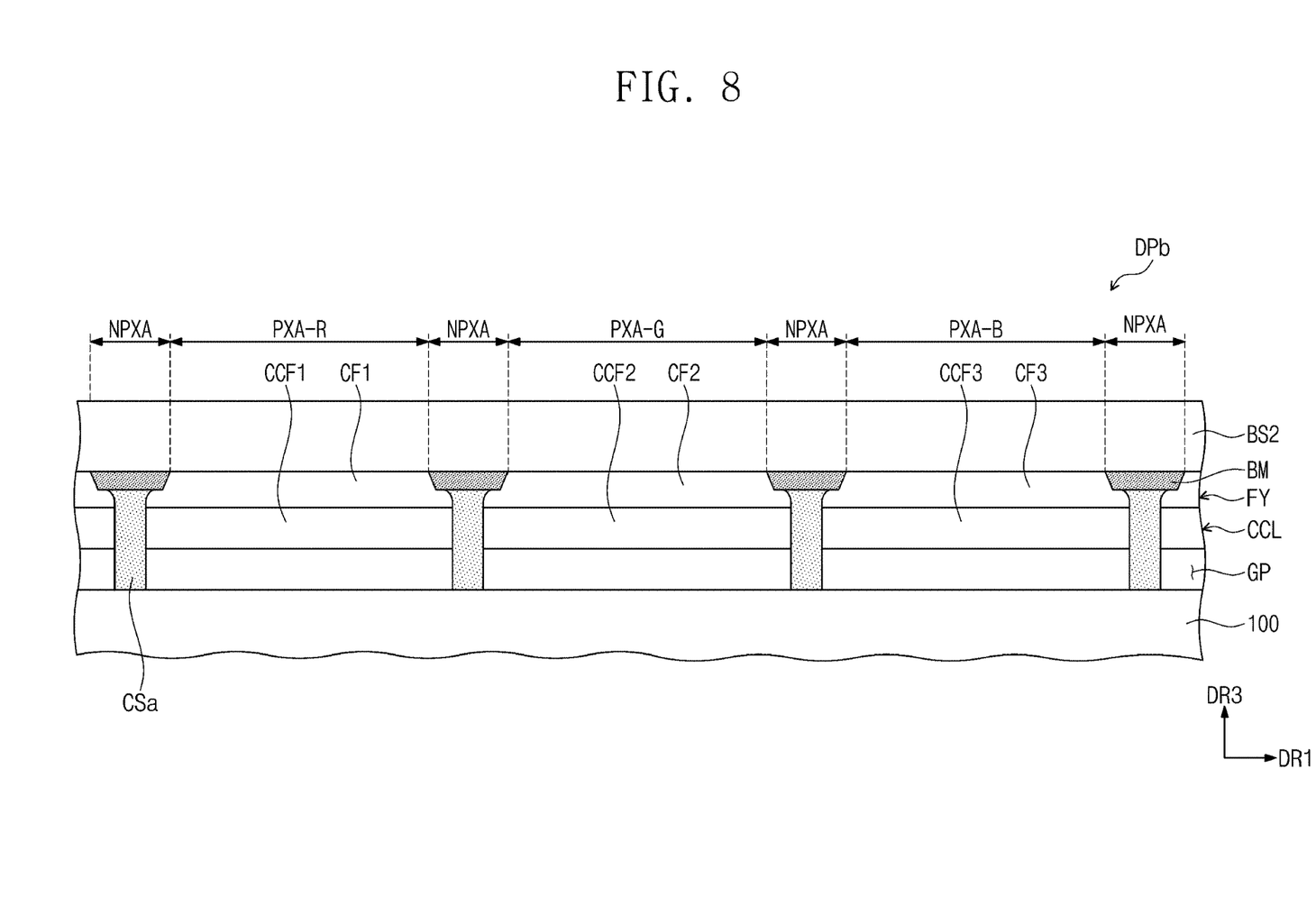
FIG. 8 is a cross-sectional view of pixel areas of a display panel according to another embodiment of the inventive concept.

FIG. 8 is a cross-sectional view of a display panel according to another embodiment of the inventive concept.

Compared with the display panel DP shown in FIG. 4, in relation to a display panel DPb shown in FIG. 8, the structure of the spacers is modified, and the structure of the remaining configurations may be substantially the same. Therefore, for convenience of explanation, further description of the remaining structures is omitted, and the structure of the spacers is mainly described.

Referring to FIG. 8, the lower display substrate 100 and the upper display substrate 200 may be spaced apart from each other in the third direction DR3 by spacers CSa.

According to an embodiment of the inventive concept, on a plane, the first conversion part CCF1, the second conversion part CCF2, and the transmission part CCF3 may be spaced apart from each other. A first space apart from each other in the first direction DR1 may be provided between the first conversion part CCF1 and the second conversion part CCF2. A second space apart from each other in the first direction DR1 may be provided between the second conversion part CCF2 and the transmission part CCF3. A third space apart from each other in the first direction DR1 may be provided between the transmission part CCF3 and the first conversion part CCF1.

In particular, the spacers CSa may be disposed in a space of at least one of the first to third spaces, and may be provided in a shape extended from the light shielding member BM. That is, the spacers CSa may be disposed between two neighboring pixel areas that emit light of different colors among the first to third pixel areas PXA-R, PXA-G, and PXA-B.

Also, the spacers CSa may overlap the light shielding area NPXA. One end of each of the spacers CSa may be connected to the light shielding member BM and the other end of each of the spacers CSa may be connected to the lower display substrate 100.

In addition, the first to third color filters CF1 to CF3 may be partitioned by the spacers CSa. For example, the first color filter CF1 and the second color filter C2 are partitioned by any one of the spacers CSa, and the second color filter CF2 and the third color filter CF3 are partitioned by another spacer of the spacers CSa.

According to an embodiment of the inventive concept, in the thickness direction of the upper display substrate 200, the thickness of each of the spacers CSa may be greater than the thickness of the first to third color filters CF1 to CF3. Also, in the thickness direction of the upper display substrate 200, the thickness of each of the spacers CSa may be greater than the thickness of each of the first conversion part CCF1, the second conversion part CCF2, and the transmission part CCF3. That is, each of the spacers CSa may be connected to a light shielding member BM through two neighboring conversion parts. As a result, the thickness of each of the spacers CSa may be larger than the sum of the thickness of the conversion part and the thickness of the color filter.

According to the above description, as each of the spacers CSa passes through the conversion part and is connected to the light shielding member BM, the light transmitted from the first to third light emitting elements OLED-B1, OLED-B2, and OLED-B3 of the lower display substrate 100 is transmitted to the first conversion part CCF1, the second conversion part CCF2, and the transmission part CCF3 without mixing.

According to embodiments of the inventive concept, the plurality of spacers may connect the light control layer and the lower display substrate. Therefore, the internal separation distance between the light control layer and the lower display substrate may be kept constant by the spacers.

Accordingly, since a phenomenon that light of different colors is mixed by the spacers is prevented or substantially prevented, the overall visibility of the display device may be improved.

Although some example embodiments of the inventive concept have been described, it is to be understood that the inventive concept should not be limited to these example embodiments, but various changes and modifications may be made by one of ordinary skill in the art within the spirit and scope of the inventive concept as herein claimed.

What is claimed is:

1. A display panel comprising:
    an upper display substrate comprising a display area and a non-display area adjacent to the display area, wherein the display area comprises first to third pixel areas and a light shielding area adjacent to the first to third pixel areas;
    a lower display substrate comprising first to third light emitting elements configured to emit a first color light and overlapping the first to third pixel areas, respectively; and
    a plurality of spacers overlapping the display area and arranged between the upper display substrate and the lower display substrate,
    wherein the upper display substrate comprises:
    a base substrate;
    a light control layer on the base substrate and configured to convert the first color light to output light of a different color; and
    a light shielding member overlapping the light shielding area and arranged between the base substrate and the light control layer,
    wherein the upper display substrate and the lower display substrate are spaced apart from each other with the plurality of spacers therebetween, the plurality of spacers being spaced apart from the light shielding member with the light control layer therebetween in a thickness direction of the upper display substrate,
    wherein the light control layer comprises:
    a first conversion part comprising a first illuminant configured to convert the first color light and emit a second color light different from the first color and overlapping the first pixel area;
    a second conversion part comprising a second illuminant configured to convert the first color light and emit a third color light different from the first color and the second color and overlapping the second pixel area; and
    a transmission part configured to transmit the first color light and overlapping the third pixel area,
    wherein the spacers comprise:
    a first spacer between the first conversion part and the first light emitting element and not overlapping the second conversion part and the transmission part;
    a second spacer between the second conversion part and the second light emitting element and not overlapping the first conversion part and the transmission part; and
    a third spacer between the transmission part and the third light emitting element and not overlapping the first conversion part and the second conversion part,
    wherein the first to third pixel areas are sequentially and alternately arranged along a first direction.

2. The display panel of claim 1, wherein the spacers overlap the light shielding area and are arranged in at least one space of a space between the first conversion part and the second conversion part, a space between the second conversion part and the transmission part, and a space between the transmission part and the first conversion part.

3. The display panel of claim 1, wherein the lower display substrate comprises a lower base substrate and a display element layer on the lower base substrate and comprising the first to third light emitting elements and a pixel defining layer,
    wherein each of the first to third light emitting elements comprises a first electrode, a pixel defining layer comprising an opening part exposing at least a portion of the first electrode, a second electrode, and a light emitting layer between the first electrode and the second electrode,
    wherein the spacers do not overlap the opening part.

4. The display panel of claim 3, wherein the light emitting layer of the first to third light emitting elements is provided in an integral shape.

5. The display panel of claim 1, further comprising an adhesive member overlapping the non-display area and arranged between the upper display substrate and the lower display substrate and defining an inner space together with the upper display substrate and the lower display substrate.

6. The display panel of claim 1, further comprising a filler configured to fill a separation space between the upper display substrate and the lower display substrate on which the spacers are arranged.

7. The display panel of claim 1, further comprising an air layer in a separation space between the upper display substrate and the lower display substrate on which the spacers are arranged.

8. The display panel of claim 1, wherein the lower display substrate further comprises a cover layer covering the first to third light emitting elements,
    wherein the spacers are between the light control layer and the cover layer.

9. The display panel of claim 1, wherein the spacers overlap the light shielding area.

10. The display panel of claim 9, wherein the first to third pixel areas are arranged as pixel areas emitting light of a same color along a second direction intersecting the first direction, wherein the spacers are between two neighboring pixel areas among the pixel areas arranged along the second direction.

11. The display panel of claim 1, wherein the upper display substrate further comprises a color filter layer,
    wherein the color filter layer comprises:
    a first color filter between the base substrate and the light control layer and overlapping the first pixel area;
    a second color filter between the base substrate and the light control layer and overlapping the second pixel area; and
    a third color filter between the base substrate and the light control layer and overlapping the third pixel area.

12. The display panel of claim 11, wherein the first color filter is configured to transmit the second color different from the first color, the second color filter is configured to transmit the third color different from the first color and the second color, and the third color filter is configured to transmit the first color.

13. The display panel of claim 11, wherein the upper display substrate further comprises a low refractive layer between the color filter layer and the light control layer.

14. The display panel of claim 1, wherein the first color is blue.

* * * * *